United States Patent [19]

Kimura et al.

[11] Patent Number: 4,918,453
[45] Date of Patent: Apr. 17, 1990

[54] A/D CONVERTER HAVING MULTIPLICATION FUNCTION

[75] Inventors: Masatoshi Kimura; Sumitaka Takeuchi; Keisuke Okada, all of Itami, Japan

[73] Assignee: Mitsubishi Denki Kabushiki Kaisha, Japan

[21] Appl. No.: 181,338

[22] Filed: Apr. 14, 1988

[30] Foreign Application Priority Data

Sep. 18, 1987 [JP] Japan .................. 62-235883

[51] Int. Cl.$^4$ ............................................. H03M 1/36
[52] U.S. Cl. ................................... 341/160; 341/159; 341/155
[58] Field of Search ................. 341/93, 132, 159, 160, 341/161

[56] References Cited

U.S. PATENT DOCUMENTS 4,612,531  9/1986  Dingwall et al. .................. 341/159
4,639,715  1/1987  Doluca ............................... 341/159
4,709,226  11/1987  Christopher ....................... 341/93

OTHER PUBLICATIONS

Verster, "IEEE Transactions on Electronic Computers", Aug. 1964, pp. 471-473.

Primary Examiner—William M. Shoop, Jr.
Assistant Examiner—Gary J. Romano
Attorney, Agent, or Firm—Townsend & Townsend

[57] ABSTRACT

A semiconductor integrated circuit which is comprised of the following; a plurality of comparators which respectively compare analog values inputted for multiplication with individual reference voltages respectively, multiplication means which controls values outputted from those plural comparators by applying signals corresponding to digital values inputted for multiplication and outputs the product of the values outputted from those plural comparators and the digital values, and a complement operation circuit which converts the value outputted from multiplication means into complement when the digital value is negative.

7 Claims, 6 Drawing Sheets

| 24a | 24b | 24c | 24d | 24e | 24f | 24g |
|-----|-----|-----|-----|-----|-----|-----|
| 0 | 0 | 1 | 1 | 1 | 1 | 1 |

COMPARATOR OUTPUT = 5

(b)

| 26a | 26b | 26c |
|-----|-----|-----|
| 1 | 0 | 1 |

ENCODE OUTPUT = 5

Fig. 5 Prior Art (a)

| 2d | 2c | 2b | 2a |
|----|----|----|----|
| 0 | 0 | 1 | 1 |

COMPARATOR OUTPUT = 2

(b)

| 6b | 6a |
|----|----|
| 1 | 1 |

DIGITAL INPUT = 3

(c)

| 8 | 9d | 9c | 9b | 9a |
|---|----|----|----|----|
| 0 | 0 | 1 | 1 | 0 |

ENCODE OUTPUT = 6

| 2d | 2c | 2b | 2a |
|----|----|----|----|
| 0  | 0  | 1  | 1  |

COMPARATOR OUTPUT=2

(b)

| 7a | 6b | 6a |
|----|----|----|
| 1  | 1  | 1  |

DIGITAL INPUT=-3 (SIGN BIT=1)

(c)

| 8 | 7b | 9d | 9c | 9d | 9a |
|---|----|----|----|----|----|
| 0 | 1  | 1  | 0  | 1  | 0  |

ENCODE OUTPUT=-6

(d)

| 7a | 6b | 6a |
|----|----|----|
| 0  | 1  | 1  |

DIGITAL INPUT=3 (SIGN BIT=0)

(e)

| 8 | 7b | 9d | 9c | 9b | 9a |
|---|----|----|----|----|----|
| 0 | 0  | 0  | 1  | 1  | 0  |

ENCODE OUTPUT=6

A/D CONVERTER HAVING MULTIPLICATION FUNCTION

BACKGROUND OF THE INVENTION

1. Field of the Invention

The present invention relates to a semiconductor integrated circuit which is provided with an A/D converter, more particularly, to a semiconductor integrated circuit which is provided with a circuit capable of applying multiplication and complement operation to the A/D converter.

2. Description of the Prior Art

A digital signal process is intended for high performance, high integration and high function as a digital integrated circuit technique has been recently proceeded even in a field of a conventional signal process by an analog circuit. A/D converters are indispensable to digitally process an originally analog signal, such as a voice or an image.

Figure 1:
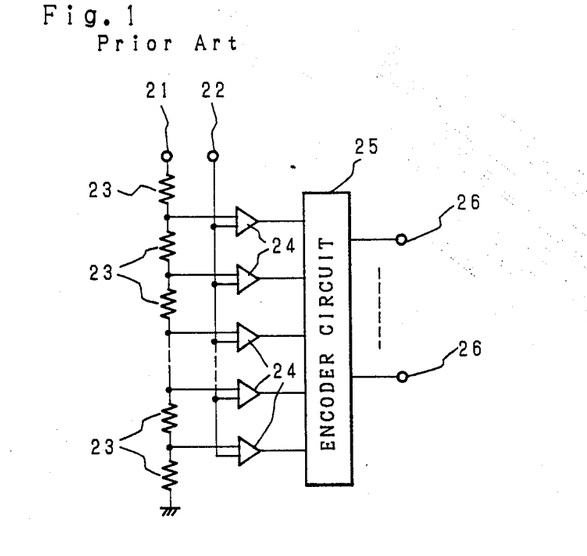
FIG. 1 is a view showing a conventional parallel comparison type A/D converter.

FIG. 1 shows a conventional parallel comparison type A/D converter. Referring to FIG. 1, the A/D converter includes a reference voltage terminal 21, an analog input terminal 22, ladder resistors 23 connected in series between the reference voltage terminal 1 and a ground for determining the reference voltages of comparators 24, a plurality of comparators 24 aligned in parallel with each other, an encoder circuit 25, and digital output terminals 26 connected to the outputs of the encoder 25.

With such arrangement of the conventional A/D converter, a voltage applied to the reference voltage terminal 21 is divided by the plurality of ladder resistors 23 connected in series, and reference voltage thus divided from the voltage by the respective ladder resistors 23 are sequentially applied to one inputs of the plurality of comparators 24, respectively. The comparators 24 compares the inputs of the reference voltages with the analog signal inputted to the analog input terminal 22, and outputs the compared results. The output of the comparators 24 are coded by the encoder circuit 25, and digital data are outputted to the output terminals 26 connected to the outputs of the encoder circuit 25. When the output includes N bits, the number of the comparators requires $(2^N-1)$ pieces.

Figure 2:
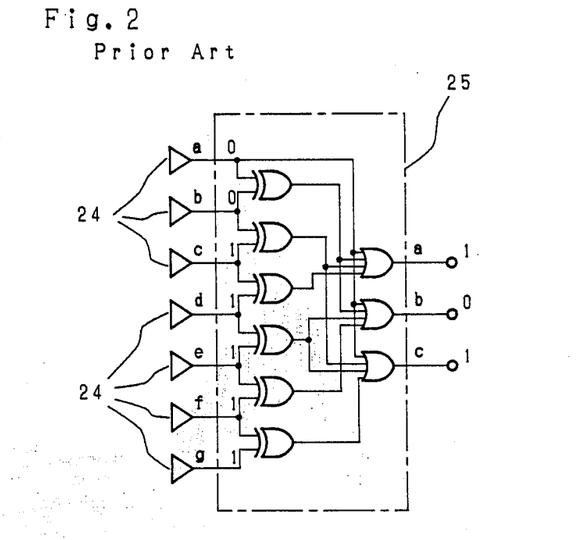
FIG. 2 is a view for describing the operation of the A/D converter shown in FIG. 1.
Figure 3:
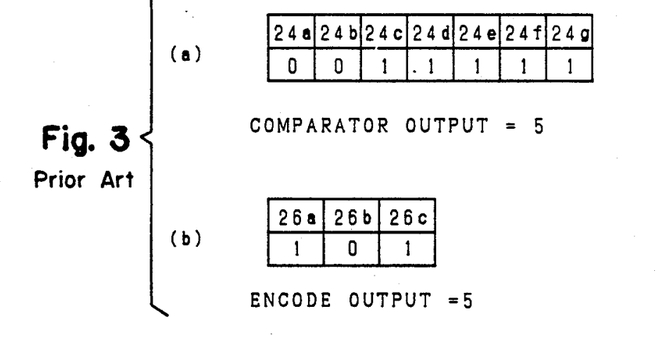
FIGS. 3(a) and 3(b) are views showing an example of the outputs of the comparators and the outputs of the encoder of the conventional A/D converter

The conventional A/D converter will be described in more detail by referring to FIGS. 2 and 3. FIG. 2 shows a parallel comparison type A/D converter of 3-bit straight binary code output, and FIGS. 3(a) and 3(b) show examples of the outputs of the comparators and the outputs of the encoder circuit of the A/D converter. This A/D converter is of parallel-comparison format, and thus, all the signals outputted from comparators are either "1" (high) or "0" (low), or the upper bit row becomes "0" and the lower bit row "1", respectively. Of these, the unit number of bit "1" denotes the analog input value in the decimal notation. The A/D converter of FIG. 2, the values of the outputs are difference between 24b and 24c.

When the encoder 25 is constructed as shown in FIG. 2 in the conventional A/D converter with the comparators 24 connected to the inputs of the encoder 25 as shown in FIG. 3(a), the output of the encoder 25 (the bit 26a is the most significant bit) produces "5" as shown in FIG. 3(b) with respect to the comparison output "5".

Since the conventional A/D converter is constructed as described above, a multiplier of another chip is required for producing a product of the digital output of the A/D converter and other data. Further, when a high speed multiplier is constructed, there arise drawbacks that the chip area of the multiplier of another chip is increased, and a number of multipliers must be integrated on the same chip.

Figure 4:
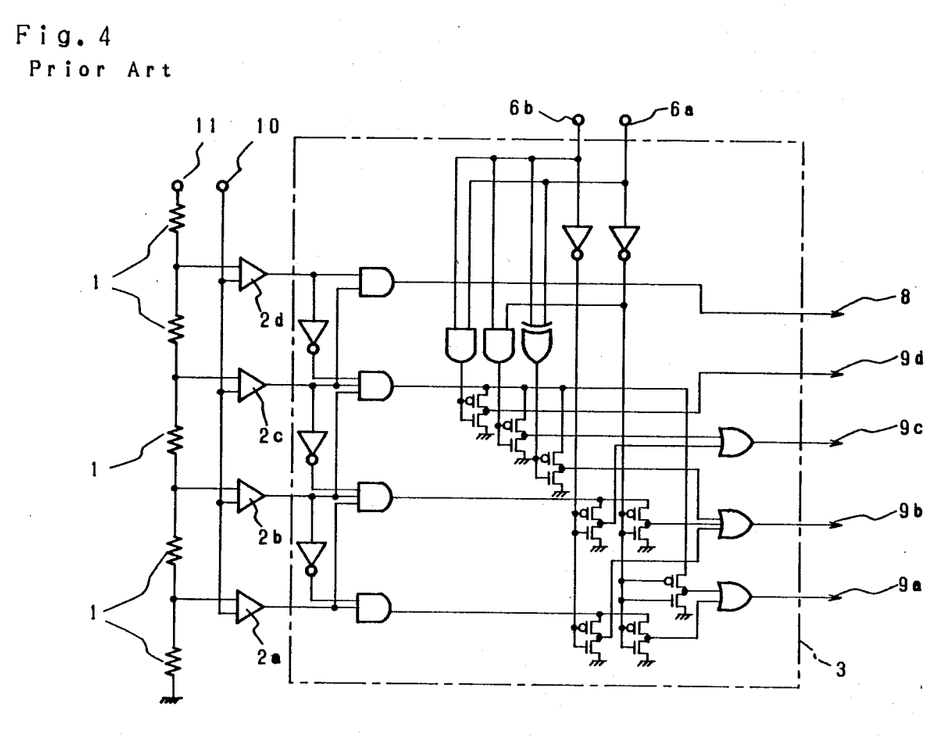
FIG. 4 is a view showing a conventional semiconductor integrated circuit which is provided with comparators and multiplication means.

To fully solve those problems mentioned above, inventors developed a semiconductor integrated circuit capable of mounting a circuit having functions of A/D converter and multiplier on a single chip. This prior invention was filed for the application for a U.S. Patent under the USP Application No. S.N. 07/111,047. The above-cited semiconductor integrated circuit is comprised of the following; a plurality of comparators for comparing the analog input signal with the reference voltage denoting the divided value of the power voltage, and multiplication means which controls signals outputted from those plural comparators mentioned above by applying control signals based on the inputted digital value and then outputs the result of the multiplication of the signal values outputted from those plural comparators by the input digital value. FIG. 4 denotes the semiconductor integrated circuit provided with those comparators and multiplication means mentioned above. The semiconductor integrated circuit shown in FIG. 4 receives 2-bit digital value for example. The semiconductor integrated circuit shown in FIG. 4 is provided with the following; ladder resistor 1 which divides the power voltage into reference voltages for each comparator; a plurality of comparators 2a, 2b ... for comparing the reference voltage to the inputted analog value; multiplication means 3 which encodes the inputted analog value into binary digital code and then output the product of the binary digital code and the inputted digital value; digital value input terminals 6a and 6b; product output terminals 9a through 9d; overflow bit terminal 8 which outputs binary digital code "1" when the inputted analog value is greater than each reference voltage; analog input terminal 10; and power voltage terminal 11, respectively.

Figure 5:
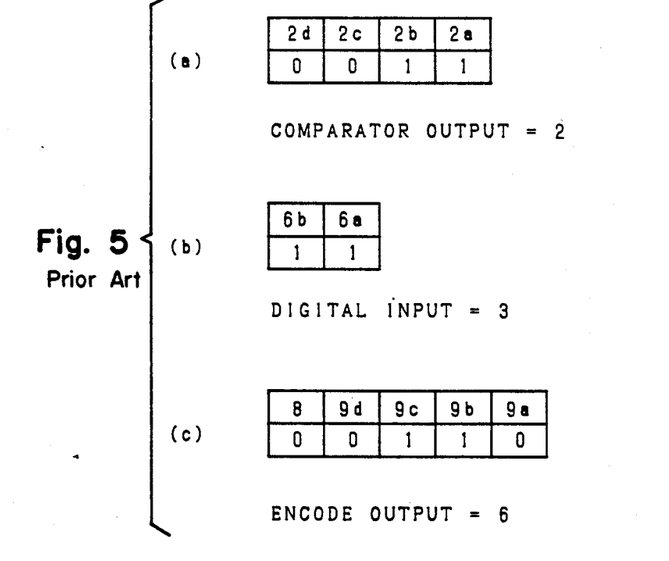
FIGS. 5a through (c) is a view showing an example of data to be inputted and outputted in the conventional integrated circuit.

Next, functional operation of the semiconductor integrated circuit related to the prior invention is described below. First, when the power voltage is delivered to the power-voltage terminal 11, ladder resistor 1,1 ... respectively divide the power voltage into reference voltages. Next, when the inputted analog value is delivered to analog input terminal 10, those reference voltages and the voltage of the inputted analog value are then delivered to comparator 2a, 2b .... The comparator 2a, 2b ... compares the magnitude of the two inputted voltages, which outputs binary digital code "1" if the voltage of the inputted analog value is higher than those reference voltages. For example, each signal outputted from comparators 2a, 2b ... corresponds to value 2 of the decimal notation of the inputted analog value in case as shown in FIG. 5(a). Next, when the digital-value input terminals 6a and 6b respectively receive binary-encoded data denoting "3" of the decimal notation as shown in FIG. 5(b), the product output terminals 9a through 9d respectively output data as shown in FIG. 5(c) denoting the result of the multiplication (inputted analog value 2)×(inputted digital value 3) =(product output value 6).

Nevertheless, since the semiconductor integrated circuit related to the prior invention is not provided with any terminal for receiving sign bits, this integrated circuit merely deals with the positive inputted digital values, and thus, if any negative inputted digital value is received, this integrated circuit cannot output the product of multiplication at all.

SUMMARY OF THE INVENTION

The primary object of the present invention is to solve the above problem by providing a novel semiconductor integrated circuit which is provided with A/D converter, multiplication means, and a circuit for calculating compliment of the signal outputted from multiplication means.

The second object of this invention is to provide a novel semiconductor integrated circuit which is provided with an A/D converter and a circuit for calculating complement of the signal outputted from multiplication means on a single chip.

The above and further objects and features of the invention will more fully be apparent from the following detailed description with accompanying drawings.

BRIEF DESCRIPTION OF THE DRAWINGS

FIGS. 8 (a) through (e) respectively are views showing an example of data to be received by and delivered from the semiconductor integrated circuit related to the invention.

DESCRIPTION OF THE PREFERRED EMBODIMENTS

Figure 6:
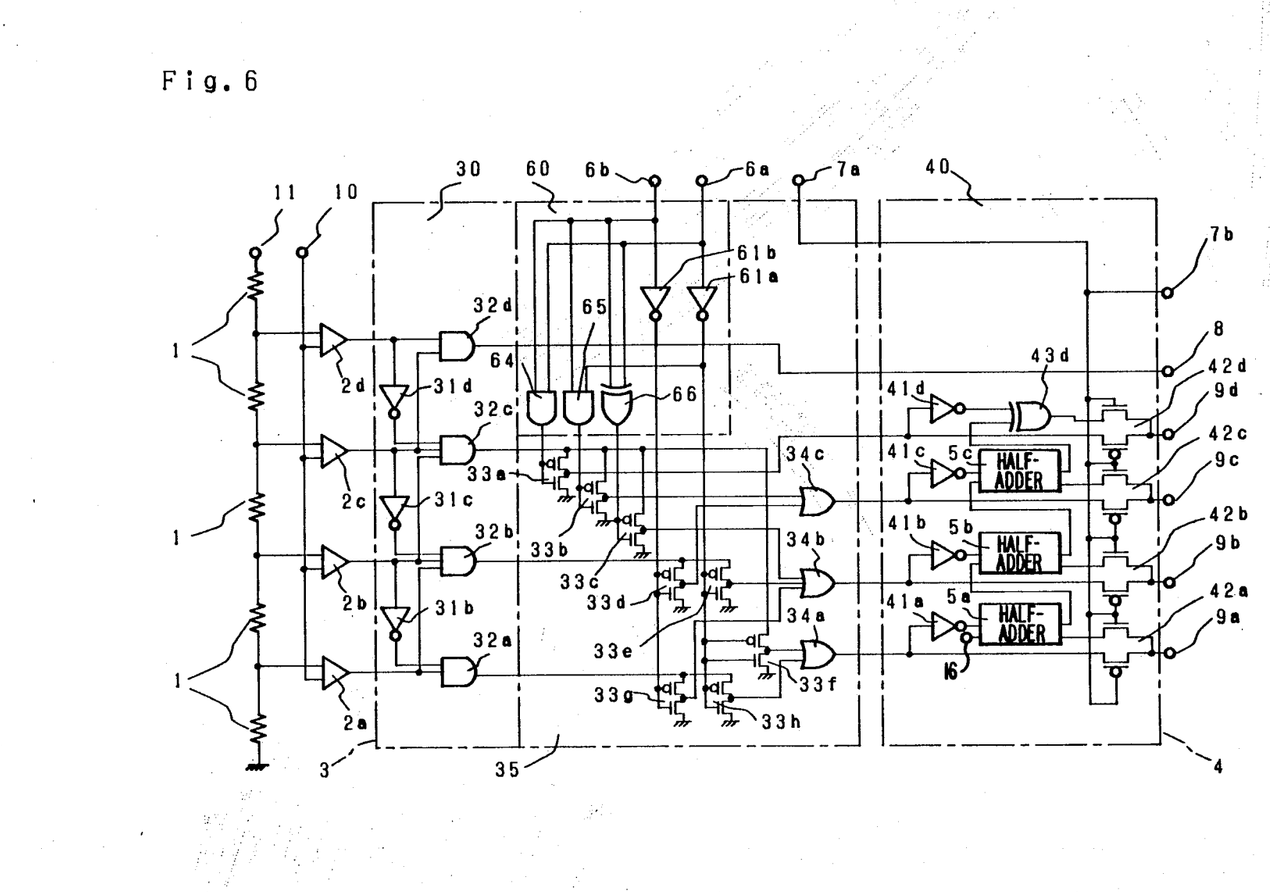
FIG. 6 is a view showing a preferred embodiment of the semiconductor integrated circuit related to the invention.

FIG. 6 denotes a view showing a preferred embodiment of the semiconductor integrated circuit related to the invention, in which 2-bit input digital value is used for example so that explanation can be simplified.

In FIG. 6, reference numeral 1 designates ladder resistors connected to each other in series, whose one end is connected to the power-voltage terminal 11 which feeds power voltage to the circuit, while the other end is grounded so that the power voltage can be divided into respective reference voltages. Interim nodes of these ladder resistors 1 are connected to an input terminal of a plurality of comparators 2a, 2b ..., respectively. These comparators 2a, 2b ... are arranged so that comparator 2a can receive low voltage, whereas comparators 2b, 2c, 2d respectively receive higher voltages in this order. The other input terminals are respectively connected to analog input terminal 10 in parallel for receiving analog value inputted for multiplication. Output terminal of comparator 2d is connected to the input terminal of AND gate 32d and the input terminal of inverter 31d. The output terminal of comparator 2c is connected to the input terminal of AND gate 32d, the input terminal of AND gate 32c, and the input terminal of inverter 31c, respectively. The output terminal of comparator 2b is connected to the input terminal of AND gate 32c, input terminal of AND gate 32b, and the input terminal of inverter 31b, respectively. The output terminal of comparator 2a is connected to the input terminal of AND gate 32b and the input terminal of AND gate 32a, respectively. Those AND gates 32a, 32b ... and inverters 31b, 31c, and 31d jointly constitute encoder circuit 30 of the A/D converter encoding signals outputted from comparators 2a, 2b, ... into binary digital codes.

Then the output terminal of AND gate 32d is connected to the overflow-bit output terminal 38 which outputs binary digital code "1" when the analog value is greater than the power voltage. The output terminal of AND gate 32c is connected in parallel to the drain of P-MOS transistor of four control switches 33a, 33b, 33c and 33f, which are respectively comprised of C-MOS transistors. The output terminal of AND gate 32b is connected to the drains of P-MOS transistors of two control switches 33d and 33e comprised of C-MOS transistors. Likewise, the output terminal of AND gate 32a is connected to two control switches 33g and 33h comprised of C-MOS transistors.

On the other hand, digital-value input terminal 6b receiving the upper bits of the 2-bit digital values inputted for multiplication is connected in parallel to AND gates 64 and 65, exclusive OR gate 66, and the input terminal of inverter 61b. Digital-value input terminal 6a receiving the lower bit of the digital value is connected in parallel to the input terminals of and gates 64 and 65, exclusive OR gate 66, and inverter 61a. The output terminal of AND gate 64 is connected in parallel to the gate of P-MOS and N-MOS transistors of the control switch 33g. Likewise, the output terminal of AND gate 65 is connected to the control switch 33b, and exclusive OR gate 66 is connected to the control switch 33c, respectively. The output terminal of inverter 61a is connected in parallel to AND gate 65 and gates of the control switches 33e, 33f, and 33h, respectively. The output terminal of inverter 61b is connected in parallel to the gates of the control switches 33d and 33g, respectively. Those AND gates 64 and 65, exclusive OR gate 66, and inverters 61a and 61b constitute control signal generator 60.

The source of N-MOS transistor of the control switch 33a is grounded, the source of P-MOS transistor is connected to the drain of N-MOS transistor, the interim mode of which is connected to the source of P-channel transistor of complement switch 42d which is comprised of two switching elements made of N-channel and P-channel transistors and the input terminal of inverter 41d. Like the control switch 33a, control switches 33b through 33h are respectively grounded, while each interim node is independently connected to the input terminals of OR gates 34c, 34b, 34c, 34b, 34a, 34b, and 34a respectively. Those control switches 33a, 33b and the OR gates 34a, 34b and 34c constitute a multiplier 35.

Likewise, encoder circuit 30, control signal generator 60, and multiplier 35 constitute multiplication means 3. Like the interim node of the control switch 33a, output terminals of OR gates 34a through 34c are respectively connected to inverters 41a, 41b, 41c and complement switches 42a through 42c. The output terminal of inverter 41d is connected to the input terminal of exclusive OR gate 42d and the output terminal of exclu- OR gate 43d is connected to the source of N-channel transistor of complement switch 42d.

Figure 7:
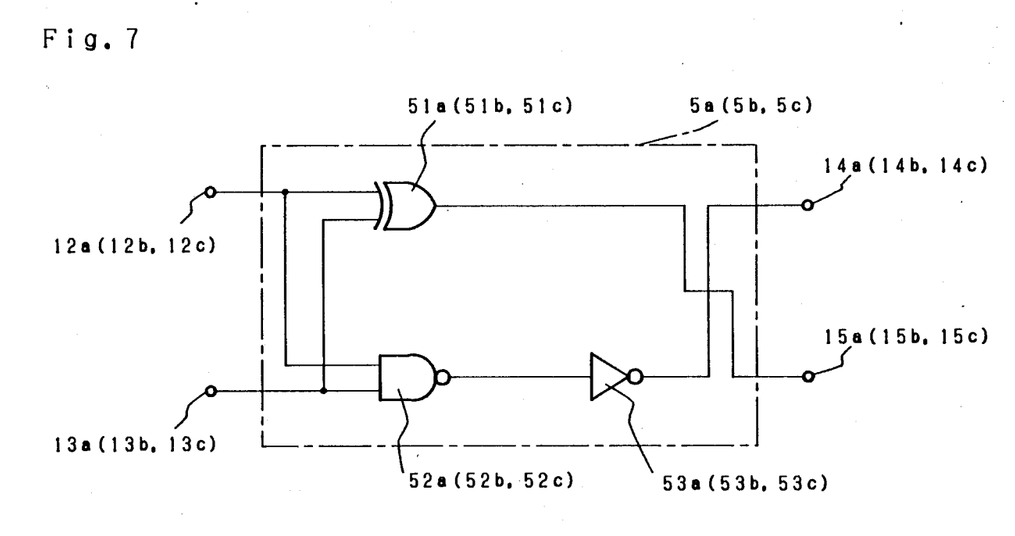
FIG. 7 is the circuit view of half-adder used for the semiconductor integrated circuit embodied by the invention.

FIG. 7 denotes the circuit of half-adder which is used for the complement operation circuit. Input terminals 12a through 12c of the half-adders 5a through 5c are respectively connected in parallel to the input terminals of exclusive OR gates 51a through 51c and the input terminals of NAND gates 52a through 52c. Likewise carry input terminals 13a through 13c are also connected to those input terminals of exclusives OR gates 51a through 51c and NAND gates 52a through 52c, respectively. The output terminals of exclusive OR gates 51a through 51c are respectively connected to sum output terminals 15a through 15c. The output terminals of NAND gates 52a through 52c are respectively connected to carry output terminals 14a through 14c via inverters 53a through 53c.

The output terminals of inverters 41a through 41c are independently connected to the input terminals 12a through 12c of the half-address 5a through 5c. The carry input terminal 13a of the half-adder 5a is connected to a second power voltage terminal 16, whereas the carry output terminal 14a is connected to the carry input terminal 13b of the half-adder 5b. The sum output terminal 15a is connected to the source of N-channel transistor of the complement switch 42a. Half-address 5b and 5c are also connected in the same way. The carry output terminal 14c of the half-adder 5c is connected to the input terminal of exclusive OR gate 43d.

The sign-bit input terminal 7a of multiplication means 3 denoting the positive or negative of digital value is connected to gates of complement switches 42a through 42d and the sign-bit output terminal 7b. Drains of N-channel and P-channel transistors of the complement switches 42a, 42b ... are respectively connected to the product output terminals 9a through 9d. Those inverters 41a, 41b, ..., half-adders 5a, 5b, ... and exclusive OR gate 42d jointly constitute operation unit 40. The operation unit 40 and complement switches 42a, 42b, ... jointly constitute the complement operation circuit 4.

Next, operation of the semiconductor integrated circuit related to the invention featuring the above constitution is described below.

Figure 8:
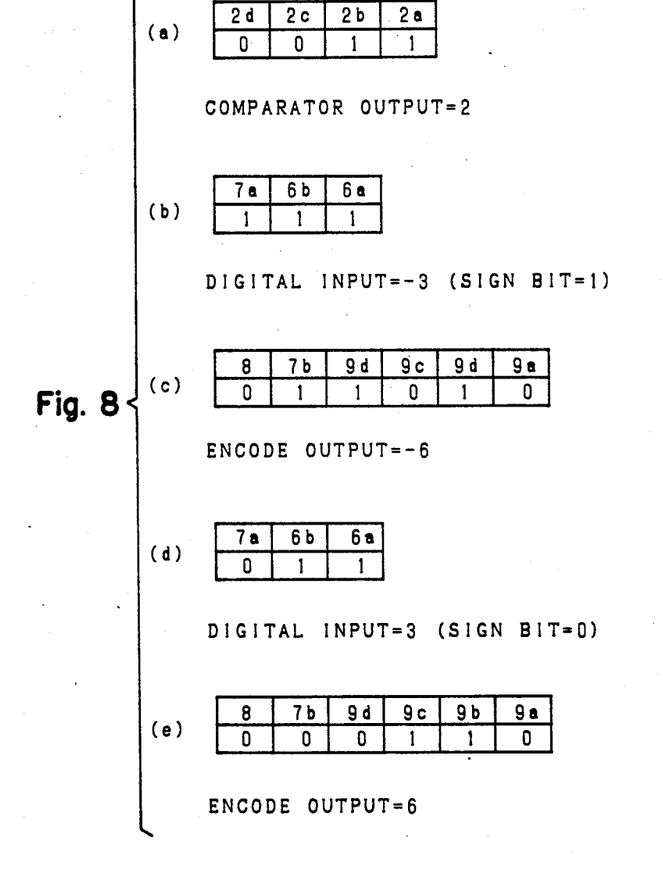

First, when the power voltage is delivered to the power-voltage terminal 11, ladder resistors 1, 1 ... divide the power voltage into reference voltages. When the analog input terminal 10 receives analog values, those reference voltages and the analog values are then delivered to comparators 2a, 2b, ..., which is substantially the circuits for comparing the magnitude of the two inputted voltages. In this embodiment, comparators 2a, 2b ... output "1" when the analog value is greater than any of those reference voltages. FIG. 8 (a), for example, denotes the case that the signal outputted from comparators 2a, 2b, ... corresponds to analog value "2" under decimal notation. Signals outputted from comparators 2a, 2b, ... are converted into binary digital code by the encoder circuit 30. In other words, of those values outputted from AND gates 32a, 32b ..., the value only from AND gate 32b becomes "1" against "0" of value outputted from other AND gates. These values are the converted into "10" of the binary notation corresponding to "2" of the decimal notation. When the digital value shown in FIG. 8 (b) corresponding to "−3" of the decimal notation is delivered to the digital value input terminals 6a and 6b and the sign-bit input terminal 7a, gates 64 through 66 and inverters 61a and 61b of the control-signal generator 60 respectively output binary digital codes "1", "0", "0", "0", "0". These codes allow each of those control switches 33a, 33b, ... to turn itself ON or OFF, thus causing output terminals of the control switch 33a and OR gates 34c, 34b, and 34a to output "0", "1", "1" and "0", which are the product of the analog and digital values, i.e., "110" in the binary notation and "6" in the decimal notation. When this condition is present, sign bit is "1" denoting that the digital value is negative. This allows N-channel transistors of complement switches 42a, 42b ... to be activated themselves to allow inverters 41a, 41b ... to invert the output bit of the product. Furthermore, half-adders 5a, 5b, ... add "1" to the lowest bit to allow two's complements of the product to be computed before eventually delivering signal corresponding to "−6" of the decimal notation to the product output terminals 9a, 9b, ... as shown in FIG. 8 (c).

On the other hand, when the sign bit is "0" as shown in FIG. 8 (d), P-channel transistors of complements switches 42a, 42b, ... are activated, outgoing signals denoting "6" of the decimal notation is directly delivered to the product output terminals 9a, 9b, ... from control switch 33a, and OR gates 34a through 34c as shown in FIG. 8 (e).

As is clear from the above description, the preferred embodiment of the semiconductor integrated circuit related to the invention provides the semiconductor integrated circuit having a plurality of comparators 2a, 2b, ... and control means 3 with complement operation circuit 4 for computing complement on two for output from the semiconductor integrated circuit, thus allowing the complement operation circuit 4 to execute computation when the digital value is negative and directly output signals of control means when the digital value is positive. The constitution mentioned above eventually allows the semiconductor integrated circuit having functions of A/D converter and multiplier to be built up on a single chip. The semiconductor integrated circuit embodied by the invention securely outputs the product value even when the digital value is negative.

The above preferred embodiment provides complement on two of operation circuits. However, the invention also allows to use any number of the complement operation circuit.

The preferred embodiment of the invention constitutes signal generating means by applying logic gates. However, the scope of the invention does not confine itself to the use of logic gates alone, but any other means may also be made available.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A semiconductor integrated circuit for receipt of analog values and digital values and for producing a mathematical product for the values and the complement of the product when the digital value is negative, comprising:

a plurality of comparators which respectively compare the analog values inputted with individual reference voltages and output representative values for said analog values;

multiplication means, coupled to said comparators, for controlling values outputted from said plural comparators by applying control signals corresponding to the digital values and for producing a multi-bit product of said representative values and said digital values; and complement operation means, coupled to said multiplication means, for converting said product into a complement product when a particular digital values is negative.

2. The semiconductor integrated circuit as claimed in claim 1, wherein said reference voltage is a divided value outputted from respective interim nodes of ladder resistors receiving predetermined voltage at one end.

3. The semiconductor integrated circuit as claimed in claim 1, wherein said complement operation means computes complements on two.

4. The semiconductor integrated circuit as claimed in claim 1, wherein said complement operation means is substantially comprised of an operation unit for computing complement and a plurality of complement switches which are respectively provided with two units of switching elements per bit of said product, said switching elements are switchable to each other in accordance with sign bit denoting the positive or negative of said digital values; wherein said complement operation means activates one of said switching elements when said digital value is positive and directly outputs said product, whereas if said digital value is negative, it activates the other switching element to output complement of said product.

5. A semiconductor integrated circuit for receipt of analog values and digital values and for producing a mathematical product for the values and the complement of the product when the digital value is negative, comprising:

a plurality of comparators which respectively compare the analog values inputted with individual reference voltages and output representative values of said analog values;

multiplication means, coupled to said comparators, for controlling values outputted from said plural comparators by applying control signals corresponding to the digital values for producing a multi-bit product of said representative values and said digital values;

said multiplication means comprised of:
  a control signal generator for generating control signal corresponding to said digital values,
  an encoder which converts said representative values outputted from said plurality of comparators into binary digital codes, and
  a multiplier which computes said multi-bit product of said digital values and said binary digital codes in accordance with said control signals; and complement operation means coupled to said multiplication means, for converting said multi-bit product into a complement product when a particular digital value is negative.

6. A semiconductor integrated circuit for receipt of analog values and digital values and for producing a mathematical product for the values and the complement of the product when the digital value is negative, comprising:

a plurality of comparators which respective compare the analog values inputted with individual reference voltages and output representative values for said analog values;

multiplication means, coupled to said comparators, for controlling values outputted from said plural comparators by applying control signals corresponding to the digital values and for producing a multi-bit product of said representative values and said digital values;

complement operation means, coupled to said multiplication means, for converting said product into a complement product when a particular digital value is negative; and wherein said plural comparators, said multiplication means and said complement operation means are mounted on a single chip.

7. A semiconductor integrated circuit for producing a multi-bit product of an analog value and a digital value and the complement of the multi-bit product when the multi-bit product is negative, comprising:

a first and a second comparator, each comparator having a first and a second input, said first input of said first comparator coupled to a first predetermined reference voltage and said first input of said second comparator coupled to second predetermined reference voltage;

said second inputs coupled to a terminal for receipt for the analog value, said comparators producing an output when said analog input exceeds said predetermined reference voltage;

a first and a second encoding AND gate, said first AND gate having said output of said first comparator as a first input, and a complement value of said output of said second comparator as a second input;

said second AND gate having said outputs of said first and second comparators as first and second inputs, wherein said analog value is digitally encoded by said encoding AND gates;

a plurality of logic gates for receiving and conditioning the digital value;

means, coupled to said plurality of logic gates and said outputs of said encoding AND gates, for producing a plurality of digital values in response to said encoded analog value and said conditioned digital value representative of said multi-bit product of said encoded analog value and said digital value; and means, coupled to said plurality of digital values, for producing the complement of said multi-bit product when said multibit product is negative.

* * * * *